(12) United States Patent
Lin

(10) Patent No.: US 11,402,960 B2
(45) Date of Patent: Aug. 2, 2022

(54) TOUCH PANEL AND DISPLAY DEVICE

(71) Applicant: Wuhan China Star Optoelectronics Semiconductor Display Technology Co., Ltd., Wuhan (CN)

(72) Inventor: Dan Lin, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 193 days.

(21) Appl. No.: 16/956,591

(22) PCT Filed: Apr. 10, 2020

(86) PCT No.: PCT/CN2020/084241
§ 371 (c)(1),
(2) Date: Jun. 21, 2020

(87) PCT Pub. No.: WO2021/179393
PCT Pub. Date: Sep. 16, 2021

(65) Prior Publication Data
US 2022/0137752 A1 May 5, 2022

(30) Foreign Application Priority Data
Mar. 11, 2020 (CN) .......................... 202010167083.9

(51) Int. Cl.
*G06F 3/045* (2006.01)
*G06F 3/044* (2006.01)
(Continued)

(52) U.S. Cl.
CPC .......... *G06F 3/0446* (2019.05); *G06F 3/0412* (2013.01); *H01L 27/323* (2013.01);
(Continued)

(58) Field of Classification Search
CPC ........... G02F 1/133357; G02F 1/13338; G02F 1/133512; G02F 1/133514;
(Continued)

(56) References Cited

U.S. PATENT DOCUMENTS

2016/0109979 A1* 4/2016 Lee ...................... G06F 3/0416
345/87
2017/0123565 A1 5/2017 Li
(Continued)

FOREIGN PATENT DOCUMENTS

CN 104656990 5/2015
CN 105204692 12/2015
(Continued)

*Primary Examiner* — Insa Sadio

(57) ABSTRACT

The present application provides a touch panel and a display device. The touch panel includes: a substrate, a touch electrode, and a light-shielding layer provided corresponding to the touch electrode. The light-shielding layer is used to shield light reflected by the touch electrode. The display device using the touch panel can reduce ambient light reflected by the touch electrode. While ensuring that the display device realizes a touch control function, contrast and color saturation of the display device are not affected, and confidentiality of private information under wide viewing angles is ensured.

17 Claims, 2 Drawing Sheets

(51) Int. Cl.
    *G06F 3/041*           (2006.01)
    *H01L 27/32*           (2006.01)
    *H01L 51/52*           (2006.01)

(52) U.S. Cl.
    CPC ...... *H01L 27/3246* (2013.01); *H01L 51/5253* (2013.01); *H01L 51/5284* (2013.01); *G06F 2203/04111* (2013.01); *H01L 2251/558* (2013.01)

(58) Field of Classification Search
    CPC . G06F 2203/04103; G06F 2203/04111; G06F 3/0412; G06F 3/0443; H01L 27/323; H01L 51/56
    See application file for complete search history.

(56) References Cited

U.S. PATENT DOCUMENTS

| | | | |
|---|---|---|---|
| 2018/0059840 A1 * | 3/2018 | Hirosawa | ............... G06F 3/0446 |
| 2019/0346972 A1 | 11/2019 | Wang | |

FOREIGN PATENT DOCUMENTS

| | | |
|---|---|---|
| CN | 106157818 | 11/2016 |
| CN | 107219953 | 9/2017 |
| CN | 107340928 | 11/2017 |
| CN | 109273482 | 1/2019 |
| CN | 110262682 | 9/2019 |
| CN | 110658946 | 1/2020 |
| CN | 110828698 | 2/2020 |
| KR | 10-2020-0017622 | 2/2020 |

* cited by examiner

TOUCH PANEL AND DISPLAY DEVICE

RELATED APPLICATIONS

This application is a National Phase of PCT Patent Application No. PCT/CN2020/084241 having International filing date of Apr. 10, 2020, which claims the benefit of priority of Chinese Patent Application No. 202010167083.9 filed on Mar. 11, 2020. The contents of the above applications are all incorporated by reference as if fully set forth herein in their entirety.

FIELD AND BACKGROUND OF THE INVENTION

The present application relates to the field of display technology, in particular to a touch panel and a display device.

Compared with liquid crystal display devices, flexible display devices made of organic light-emitting diodes have advantages of high contrast, high color saturation, wide viewing angles, lightness and thinness, bendability, and foldability, and have become a research hotspot in a current field of display technology. In the flexible display devices, in order to better balance a touch function and a thickness of a product, a touch layer is generally manufactured directly on a display panel to make an entire product thinner and lighter. This not only realizes the touch function, but also makes the display panel easier to fold. However, this method of directly manufacturing the touch layer on the display panel has certain deficiencies. Because the touch layer is made of metal, light reflected in environment is increased to a certain extent, such that contrast and color saturation are reduced. In addition, because the flexible display devices have a characteristic of wide viewing angles, it is not conducive to confidentiality of information, and is also disadvantageous to users who have privacy requirements. Therefore, how to ensure that the contrast and color saturation of the display panel is not affected while realizing the touch control function and ensuring the confidentiality of information under wide viewing angles are issues of great concern.

Embodiments of the present application provide a touch panel and a display device, which can reduce the ambient light reflected by touch electrodes.

SUMMARY OF THE INVENTION

An embodiment of the present application provides a touch panel, including: a substrate; a touch electrode disposed on the substrate; and a light-shielding layer disposed on one side of the touch electrode away from the substrate; wherein the light-shielding layer is disposed corresponding to the touch electrode, and the light-shielding layer is configured to shield the light reflected by the touch electrode.

In some embodiments, a width of an orthographic projection of the light-shielding layer on the substrate is greater than a width of an orthographic projection of the touch electrode on the substrate.

In the touch panel, the width of the orthographic projection of the touch electrode on the substrate is greater than 0 μm and less than or equal to 5 μm.

In the touch panel, a preparation material of the light-shielding layer includes one of a black organic photoresist or a black organic resin.

In the touch panel, the touch panel further includes: an array substrate and a light-emitting device between the substrate and the touch electrode; a light-emitting device disposed on one side of the array substrate away from the substrate.

In the touch panel, the touch panel further includes: an array substrate and a light-emitting device between the substrate and the touch electrode.

A light-emitting device disposed on one side of the array substrate away from the substrate.

The array substrate includes a pixel definition layer provided on one side of the light-emitting device; the light-emitting device includes a pixel unit disposed in a groove of the pixel definition layer. The orthographic projection of the touch electrode on the pixel definition layer is between the corresponding two pixel units.

In the touch panel, a width of the orthographic projection of the light-shielding layer on the pixel definition layer is less than or equal to a first pitch positioned between the two of the pixel units.

In the touch panel, the first pitch is greater than or equal to 15 μm and less than or equal to 25 μm.

In the touch panel, the first pitch is equal to 20 μm.

In the touch panel, the width of the orthographic projection of the light-shielding layer on the pixel definition layer is less than or equal to 25 μm.

In the touch panel, the width of the orthographic projection of the light-shielding layer on the pixel definition layer is less than or equal to 20 μm.

In the touch panel, the touch electrodes include: a first electrode disposed on one side of the substrate; a second electrode disposed on one side of the first electrode away from the substrate, the light-shielding layer disposed corresponding to the second electrode and covering the second electrode; and a first insulating layer disposed between the first electrode and the second electrode; wherein the width of the orthographic projection of the light-shielding layer on the substrate is greater than a width of an orthographic projection of the second electrode on the substrate, and an orthographic projection of the second electrode on the pixel definition layer is disposed between the two of the pixel units.

In the touch panel, the width of the orthographic projection of the second electrode on the substrate is greater than 0 μm and less than or equal to 5 μm.

In the touch panel, the width of the orthographic projection of the second electrode on the substrate is equal to 3 μm.

In the touch panel, the touch panel further includes an encapsulation layer disposed on one side of the light-emitting device away from the substrate, and a buffer layer disposed between the light-emitting device and the touch electrode.

In the touch panel, a thickness of the buffer layer is greater than or equal to 0.3 μm and less than or equal to 60 μm.

In the touch panel, the thickness of the buffer layer is greater than or equal to 2 μm and less than or equal to 5 μm.

In the touch panel, the thickness of the buffer layer is equal to 3 μm.

In the touch panel, the touch panel further includes a second insulating layer disposed on one side of the light-shielding layer away from the substrate.

The present application also provides a display device including the touch panel.

Compared with the prior art, a touch panel and a display device provided by the present application include a substrate; a touch electrode disposed on the substrate; and a light-shielding layer disposed on one side of the touch electrode away from the substrate; wherein the light-shielding layer is disposed corresponding to the touch electrode, and the light-shielding layer is configured to shield the light reflected by the touch electrode. The display device using the touch panel can reduce ambient light reflected by the touch electrodes. While ensuring that the display device realizes the touch control function, the contrast and color saturation of the display device are not affected, and the confidentiality of private information under wide viewing angles is ensured.

DESCRIPTION OF SPECIFIC EMBODIMENTS OF THE INVENTION

In order to make the purpose, technical solutions, and effects of the present application clearer and more unambiguous, the present application will be further described in detail with reference to the accompanying drawings and embodiments. It should be understood the specific embodiments described herein are only used to explain the present application, and are not used to limit the present application.

Figure 1A:
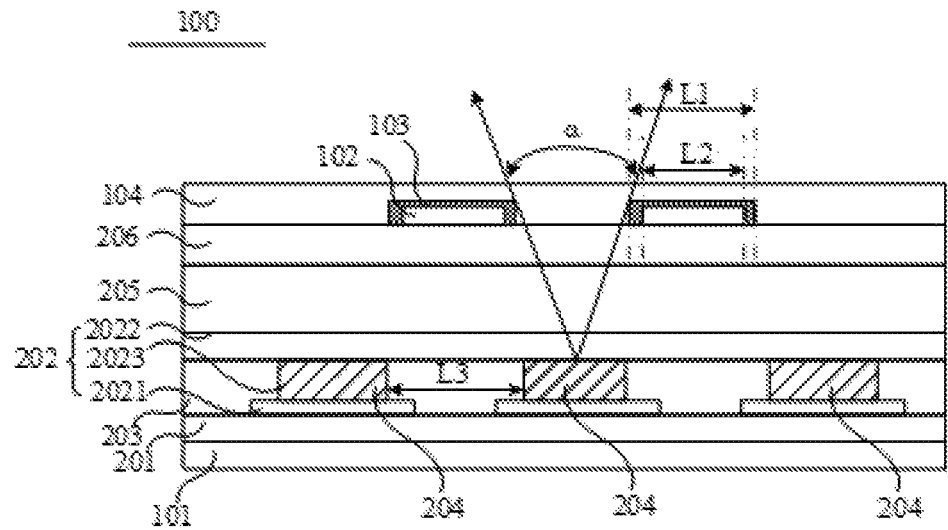
FIG. 1A and FIG. 1B are schematic structural diagrams of a touch panel provided by an embodiment of this application.
Figure 1B:
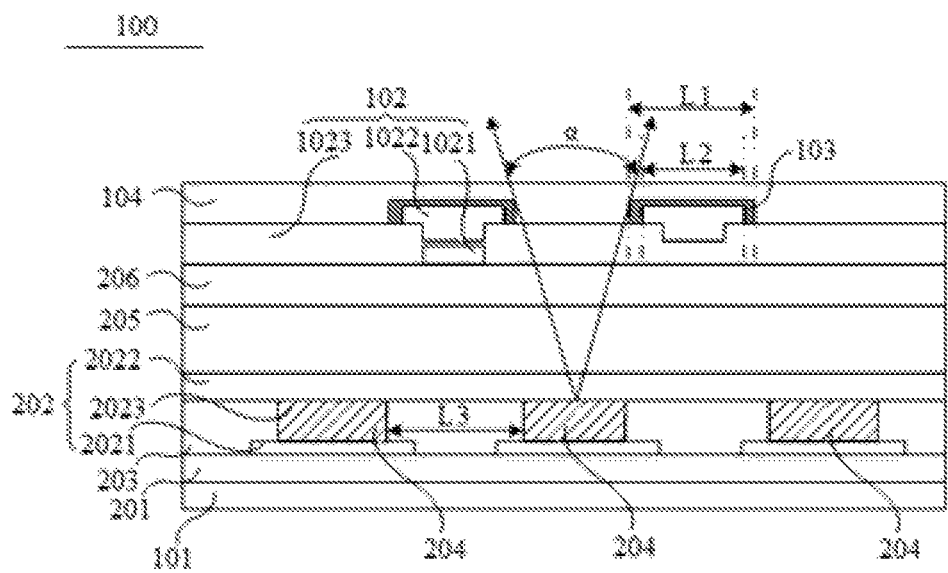

Specifically, please refer to FIG. 1A and FIG. 1B, which are schematic structural diagrams of touch panels provided by embodiments of the present application. The touch panel 100 includes: a substrate 101; a touch electrode 102 disposed on the substrate 101; and a light-shielding layer 103 disposed on one side of the touch electrode 102 away from the substrate 101, wherein the light-shielding layer 103 is disposed corresponding to the touch electrode 102, and the light-shielding layer 103 is configured to shield light reflected by the touch electrode 102.

A width L1 of an orthographic projection of the light-shielding layer 103 on the substrate 101 is greater than a width L2 of an orthographic projection of the touch electrode 102 on the substrate 101. Further, the width L2 of the orthographic projection of the touch electrode 102 on the substrate 101 is greater than 0 μm and less than or equal to 5 μm, that is, 0 μm<L2≤5 μm.

A preparation material of the light-shielding layer 103 includes one of a black organic photoresist or a black organic resin.

In addition, in order to prevent the touch electrode 102 from being corroded by water and oxygen and from an occurrence of oxidation phenomenon, the touch panel 100 is further provided with a second insulating layer 104 on one side of the light-shielding layer 103 away from the substrate. The second insulating layer 104 can prevent metal oxidation of the touch electrode 102 and can flatten the touch electrode 102 and the light-shielding layer 103.

Please continue to refer to FIG. 1A and FIG. 1B. The touch panel 100 further includes: an array substrate 201 and a light-emitting device 202 between the substrate 101 and the touch electrode 102.

The light-emitting device 202 is disposed on one side of the array substrate 201 away from the substrate 101.

The array substrate 201 includes a pixel definition layer 203 provided on one side of the light-emitting device 202. The light-emitting device 202 includes a pixel unit 204 disposed in a groove of the pixel definition layer 203. The orthographic projection of the touch electrode 102 on the pixel definition layer 203 is positioned between corresponding two pixel units 204 to prevent the touch electrode 102 and the light-shielding layer 103 from shielding the light emitted by the light-emitting device 202.

Further, the width L1 of the orthographic projection of the light-shielding layer 103 on the pixel defining layer 203 is less than or equal to a first pitch L3 between the corresponding two pixel units 204, that is, L1≤L3.

Since an aperture ratio of the touch panel 100 is inversely proportional to the first pitch L3, in order to not affect the aperture ratio of the touch panel 100, the first pitch L3 is greater than or equal to 15 μm and less than or equal to 25 μm, that is 15 μm≤L3≤25 μm. Further, the width L1 of the orthographic projection of the light-shielding layer 103 on the pixel defining layer 203 is less than or equal to 25 μm, that is, L1≤25 μm. Furthermore, the first pitch L3 is equal to 20 μm, and the width L1 of the orthographic projection of the light-shielding layer 103 on the pixel defining layer 203 is less than or equal to 20 μm, that is, L3=20 μm, and L1≤20 μm.

The array substrate 201 includes thin film transistors distributed in an array; the light-emitting device 202 includes an anode 2021 electrically connected to one of a source or a drain of the thin film transistors and a cathode 2022 disposed on one side of the anode 2021 away from the substrate 101; and a light-emitting layer 2023 is disposed between the anode 2021 and the cathode 2022. The light-emitting layer 2023 can make the pixel unit 204 emit red light, green light, or blue light based on different materials.

Please continue to refer to FIG. 1A and FIG. 1B. The touch panel 100 further includes an encapsulation layer 205 on one side of the light-emitting device 202 away from the substrate 101 and a buffer layer 206 disposed between the light-emitting device 202 and the touch electrode 100, to isolate the light-emitting device 202 and the touch electrode 102, and prevent the light-emitting device 202 from being corroded by water and oxygen. The encapsulation layer 205 is a multilayer organic film layer and an inorganic film layer stacked alternately to prevent the light-emitting device 202 from being corroded by water and oxygen. The buffer layer 206 can prevent the light-emitting device 202 from being damaged during the manufacturing of the touch electrode 102.

Since the thicker the buffer layer 206 is, the wider the light-shielding layer 103 is, and the narrower the viewing angles α of the touch panel 100 are, side visibility of the touch panel 100 is also reduced accordingly. When a viewer is watching the touch panel 100 outside his viewing angles α, light received by the pixel unit 204 within the viewer's viewing angles is less than light received when the viewer is watching the touch panel 100 inside his viewing angles α, that is, a brightness of the touch panel 100 at this time is low. When the angles deviating from the viewing angles α are greater, the brightness of the touch panel 100 viewed is lower, and information viewed from the touch panel 100 is less. In this way, the purpose of preventing peeping can be achieved.

However, an increased thickness of the buffer layer 206 will also cause following two effects: First, it will increase the thickness of the touch panel 100, which will affect the thinness and lightness design of the touch panel 100. Second, the thicker the buffer layer 206 is, the longer the transmission path of light emitted by the light-emitting device 202 is in the touch panel 100, resulting in more light loss in the touch panel 100. Therefore, in order to reduce an impact on the light emitted by the touch panel 100 and the light-emitting device 202 and facilitate lightness and thinness design, the thickness of the buffer layer 206 is greater than or equal to 0.3 µm and less than or equal to 60 µm. Further, the thickness of the buffer layer 206 is greater than or equal to 2 µm and less than or equal to 5 µm. Furthermore, the thickness of the buffer layer 206 is equal to 3 µm.

Please continue to refer to FIG. 1B. The touch electrode 102 includes: a first electrode 1021 disposed on one side of the substrate 101; a second electrode 1022 disposed on a side of the first electrode 1021 away from the substrate 101, and the light-shielding layer 103 is disposed corresponding to the second electrode 1022 and covers the second electrode 1022; and a first insulating layer 1023 disposed between the first electrode 1021 and the second electrode 1022 to isolate the first electrode 1021 and the second electrode 1022.

Wherein a width L1 of an orthographic projection of the light-shielding layer 103 on the substrate 101 is greater than a width L2 of an orthographic projection of the second electrode 1022 on the substrate 101. An orthographic projection of the second electrode 1022 on the pixel definition layer 203 is disposed between the corresponding two pixel units 204. Specifically, the width L2 of the orthographic projection of the second electrode 1022 on the substrate 101 is greater than 0 µm and less than or equal to 5 µm, that is, 0 µm<L2≤5 µm, L1>L2. Further, the width L2 of the orthographic projection of the second electrode 1022 on the substrate 101 is 3 µm, that is, L2=3 µm; L1>3 µm.

Figure 1C:
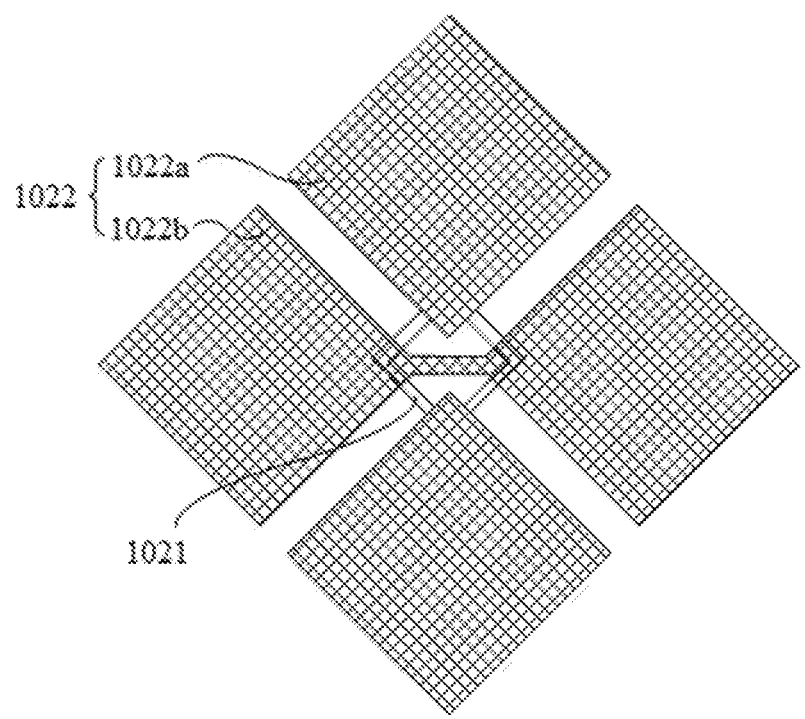
FIG. 1C is a schematic structural diagram of touch electrodes of the touch panel provided in FIG. 1B.

The first electrode 1021 is a grid structure or a conductive bridge; the second electrode 1022 is a grid structure. Specifically, when the first electrode 1021 is a conductive bridge, please refer to FIG. 1C, which is a schematic structural diagram of a touch electrode of the touch panel provided in FIG. 1B. The second electrode 1022 further includes a sensing electrode 1022a and a driving electrode 1022b, wherein the sensing electrode 1022a and the driving electrode 1022b are both grid structures. One of the sensing electrode 1022a or the driving electrode 1022b is bridged through the first electrode 1021.

Preparation materials of the first electrode 1021 and the second electrode 1022 are low-reflectivity metal materials.

The present application also provides a display device including the touch panel 100 to reduce the ambient light reflected by the touch electrode 102. While ensuring that the display device realizes the touch control function, the contrast and color saturation of the display device are not affected, and the confidentiality of private information under wide viewing angles is guaranteed.

The touch panel 100 and the display device provided in the embodiments of the present application include a substrate 101; a touch electrode 102 disposed on the substrate 101; and a light-shielding layer 103 disposed on one side of the touch electrode 102 away from the substrate 101, wherein the light-shielding layer 103 is provided corresponding to the touch electrode 102, and the light-shielding layer 103 is configured to shield the light reflected by the touch electrode 102. The display device using the touch panel 100 can reduce the ambient light reflected by the touch electrode 102. While ensuring that the display device realizes the touch control function, the contrast and color saturation of the display device are not affected, and the confidentiality of private information under wide viewing angles is guaranteed.

In the above embodiments, the description of each embodiment has its own emphasis. For a part that is not detailed in an embodiment, please refer to the relevant descriptions of other embodiments.

The touch panel and the display device provided in the embodiments of the present application have been described in detail above, and specific examples have been applied in this article to explain the principles and implementation modes of the present application. The descriptions of the above embodiments are only used to help understand the technical solutions and core ideas of the present application. Those of ordinary skill in the art should understand that they can still modify the technical solutions described in the foregoing embodiments, or equivalently substitute some of the technical features. However, these modifications or substitutions do not deviate from the scope of the technical solutions in the embodiments of the present application.

What is claimed is:

1. A touch panel, comprising:
a substrate;
a touch electrode disposed on the substrate;
an array substrate and a light-emitting device disposed between the substrate and the touch electrode, wherein the light-emitting device is disposed on one side of the array substrate away from the substrate; and
a light-shielding layer disposed on one side of the touch electrode away from the substrate;
wherein the light-shielding layer is disposed corresponding to the touch electrode, the light-shielding layer is configured to shield light reflected by the touch electrode, and a width of an orthographic projection of the light-shielding layer on the substrate is greater than a width of an orthographic projection of the touch electrode on the substrate; and
wherein the array substrate comprises a pixel definition layer disposed on one side of the light-emitting device, the light-emitting device comprises pixel units, each pixel unit is disposed in a respective groove of the pixel definition layer, and an orthographic projection of the touch electrode on the pixel definition layer is positioned between respective two of the pixel units corresponding to the touch electrode.

2. The touch panel according to claim 1, wherein the width of the orthographic projection of the touch electrode on the substrate is greater than 0 µm and less than or equal to 5 µm.

3. The touch panel according to claim 1, wherein a preparation material of the light-shielding layer comprises one of a black organic photoresist or a black organic resin.

4. The touch panel according to claim 1, wherein a width of the orthographic projection of the light-shielding layer on the pixel definition layer is less than or equal to a first pitch positioned between the two of the pixel units.

5. The touch panel according to claim 4, wherein the first pitch is greater than or equal to 15 µm and less than or equal to 25 µm.

6. The touch panel according to claim 5, wherein the first pitch is equal to 20 µm.

7. The touch panel according to claim 4, wherein the width of the orthographic projection of the light-shielding layer on the pixel definition layer is less than or equal to 25 µm.

8. The touch panel according to claim 7, wherein the width of the orthographic projection of the light-shielding layer on the pixel definition layer is less than or equal to 20 µm.

9. The touch panel according to claim 1, wherein the touch electrode comprises:
a first electrode disposed on one side of the substrate;
a second electrode disposed on one side of the first electrode away from the substrate, the light-shielding layer being disposed corresponding to the second electrode and covering the second electrode; and a first insulating layer disposed between the first electrode and the second electrode;

wherein the width of the orthographic projection of the light-shielding layer on the substrate is greater than a width of an orthographic projection of the second electrode on the substrate, and an orthographic projection of the second electrode on the pixel definition layer is positioned between the two of the pixel units.

10. The touch panel according to claim 9, wherein the width of the orthographic projection of the second electrode on the substrate is greater than 0 μm and less than or equal to 5 μm.

11. The touch panel according to claim 10, wherein the width of the orthographic projection of the second electrode on the substrate is equal to 3 μm.

12. The touch panel according to claim 1, wherein the touch panel further comprises an encapsulation layer disposed on one side of the light-emitting device away from the substrate, and a buffer layer disposed between the light-emitting device and the touch electrode.

13. The touch panel according to claim 12, wherein a thickness of the buffer layer is greater than or equal to 0.3 μm and less than or equal to 60 μm.

14. The touch panel according to claim 13, wherein the thickness of the buffer layer is greater than or equal to 2 μm and less than or equal to 5 μm.

15. The touch panel according to claim 14, wherein the thickness of the buffer layer is equal to 3 μm.

16. The touch panel according to claim 1, wherein the touch panel further comprises a second insulating layer disposed on one side of the light-shielding layer away from the substrate.

17. A display device, comprising the touch panel of claim 1.

* * * * *

UNITED STATES PATENT AND TRADEMARK OFFICE
CERTIFICATE OF CORRECTION

PATENT NO. : 11,402,960 B2  
APPLICATION NO. : 16/956591  
DATED : August 2, 2022  
INVENTOR(S) : Dan Lin Page 1 of 1

It is certified that error appears in the above-identified patent and that said Letters Patent is hereby corrected as shown below:

On the Title Page

In item (73) Assignee:
"Wuhan China Star Optoelectronies Semiconductor Display Technology Co., Ltd."

Should be changed to:
--Wuhan China Star Optoelectronics Semiconductor Display Technology Co., Ltd.--

Signed and Sealed this
Sixth Day of June, 2023

Katherine Kelly Vidal
*Director of the United States Patent and Trademark Office*